(12) United States Patent
Aoki et al.

(10) Patent No.: US 7,078,151 B2
(45) Date of Patent: Jul. 18, 2006

(54) PHOTOSENSITIVE ELEMENT, METHOD FOR FORMING RESIST PATTERN, AND METHOD FOR MANUFACTURING PRINTED WIRING BOARD

(75) Inventors: Tomoaki Aoki, Hitachi (JP); Taku Kawaguchi, Hitachi (JP); Tatsuya Ichikawa, Hitachi (JP)

(73) Assignee: Hitachi Chemical Co., Ltd., Tokyo (JP)

( * ) Notice: Subject to any disclaimer, the term of this patent is extended or adjusted under 35 U.S.C. 154(b) by 0 days.

(21) Appl. No.: 10/381,020

(22) PCT Filed: Sep. 20, 2001

(86) PCT No.: PCT/JP01/08192

§ 371 (c)(1),
(2), (4) Date: Aug. 25, 2003

(87) PCT Pub. No.: WO02/25377

PCT Pub. Date: Mar. 28, 2002

(65) Prior Publication Data

US 2004/0018446 A1    Jan. 29, 2004

(30) Foreign Application Priority Data

Sep. 20, 2000    (JP)    ............... 2000-285465

(51) Int. Cl.
| | |
|---|---|
| G03C 1/76 | (2006.01) |
| G03C 1/795 | (2006.01) |
| G03F 7/028 | (2006.01) |
| G03F 7/09 | (2006.01) |
| G03F 7/30 | (2006.01) |

(52) U.S. Cl. ............... 430/271.1; 430/281.1; 430/285.1; 430/325; 430/311; 430/313; 430/314; 430/315; 430/319

(58) Field of Classification Search .......... 430/271.1, 430/281.1, 285.1, 905, 910, 916, 920, 325, 430/311, 313, 318, 286.1, 315
See application file for complete search history.

(56) References Cited

U.S. PATENT DOCUMENTS 4,629,680 A * 12/1986 Iwasaki et al. .......... 430/288.1

FOREIGN PATENT DOCUMENTS

| JP | 63-200155 | * | 8/1988 |
|---|---|---|---|
| JP | 04-248843 | | 9/1992 |
| JP | 06-287288 | | 10/1994 |
| JP | 8-87106 | * | 4/1996 |
| JP | 09-211851 | | 8/1997 |
| JP | 2982311 | | 9/1999 |
| JP | 2000-214583 | | 8/2000 |
| JP | 2001-005178 | | 1/2001 |

OTHER PUBLICATIONS

DERWENT abstract for JP 2000-214583 (Ishikawa et al).*
Machine-Assisted English translation for the claims of JP 2000-214583 (Ishikawa et al) provided by JPO.*
DERWENT abstract for JP 8-87106 (Tanizaki et al).*
JPO abstract for JP 8-87106 (Tanizaki et al). DERWENT abstract for JP 63-200155 (Takeuchi et al).*
English translation of JP 2000-214583 (Ishikawa et al), provided by PTO.*
English translation of JP 63-200155(Takeuchi et al), provided by PTO.*
Machine-assisted English translation of JP 06-287288 (Oosaki et al), provided by JPO.*
English translation of JP 8-87106 (Tanizaki et al), provided by PTO.*
Copy of Notice of Rejection, dispatched Jun. 29, 2005, from the Korean Patent Office regarding Korean Patent Application No. 10-2003-7003987, 3 pages.
Machine English translation of Japanese Patent 2,982,311, obtained from www4.ipdl.ncipi.go.jp on Sep. 26, 2005, 20 pages.

* cited by examiner

*Primary Examiner*—Sin Lee
(74) *Attorney, Agent, or Firm*—Griffin & Szipl, P.C.

(57) ABSTRACT

A photosensitive element comprising a support film and a photosensitive resin layer formed on the support film is provided, wherein the support film is a multilayer support film comprising at least three layers; and wherein the photosensitive resin layer comprises a photosensitive resin composition comprising (A) a binder polymer, (B) a photopolymerizable compound having at least one polymerizable ethylenically unsaturated group within a molecule, and (C) a photopolymerization initiator. Also provided are a method of forming a resist pattern comprising the steps of laminating such a photosensitive element onto a circuit-forming substrate such that the photosensitive resin layer comes into close contact therewith; forming an exposure part by irradiating a predetermined part of the photosensitive resin layer with an active light beam; and then eliminating a part other than the exposure part; and a method of making a printed circuit board comprising the step of etching or plating the circuit-forming substrate formed with a resist pattern by this method of forming a resist pattern.

13 Claims, No Drawings

PHOTOSENSITIVE ELEMENT, METHOD FOR FORMING RESIST PATTERN, AND METHOD FOR MANUFACTURING PRINTED WIRING BOARD

TECHNICAL FIELD

The present invention relates to a photosensitive element, and methods of forming a resist pattern and making a printed circuit board using the same.

BACKGROUND ART

Photosensitive elements used for making a printed circuit board usually have a form of a laminated film in which a layer of photosensitive resin composition is sandwiched between a support film and a protective film. Upon their use, the layer of photosensitive resin composition is laminated on a circuit-forming substrate while peeling off the protective film. After being selectively irradiated with ultraviolet rays by way of a predetermined mask, the layer is subjected to a development process, so as to form an image on the printed circuit board.

DISCLOSURE OF THE INVENTION

While a single-layer film made of polyester is often used as the support film for photosensitive elements, polyester multilayer films made of a plurality of layers have recently been developed various purposes and, consequently, the present inventors considered employing such multilayer films as the support film for photosensitive elements.

Then, the present inventors investigated the use of such multilayer films as the support film for photosensitive elements and found that there were problems as described below:

In multilayer films, their outermost layers have been made to contain fine particles (inert particles) to take into consideration slippage at the time of making and the like (Japanese Patent Application Laid-Open No. 51-122178 and the like). Since thus fine particles contained have often been made with a size greater than the thickness of the outermost layers so as to protrude intentionally from the outermost layers, the layer of photosensitive resin composition (photosensitive resin layer) may become irregular, whereby bubbles may be entrained at the time of lamination onto the circuit-forming substrate. When the multilayer film is a two-layer film, the problem mentioned above may be solved to some extent if the photosensitive resin layer is formed on a layer which does not contain the above-mentioned fine particles. However, in a multilayer film having three or more layers in which both the surface and back layers contain the above-mentioned fine particles it is hard to suppress the occurrence of irregularities in the layer of photosensitive resin composition.

Also, a multilayer film comprising a layer including fine particles has been problematic in that it cannot enhance the resolution of the photosensitive resin layer when irradiated with light through the film. Such a problem also has occurred in the case where multilayer films comprising no layer containing fine particles is used. Namely, even the layers containing no fine particles differ from each other in terms of transparency and refractive index, whereby there has been a problem that the resolution of the layer of photosensitive resin composition deteriorates when irradiated with light through the multilayer film.

In view of such problems, it is an object of the present invention to provide a photosensitive element comprising a support film and a photosensitive resin layer formed on the support film, which is hard to entrain bubbles at the time when laminated on a circuit-forming substrate and can fully enhance the resolution even if the support film is a multilayer film of three layers or more or even if the outermost layer contains fine particles. It is another object of the present invention to provide a method of forming a resist pattern using such a photosensitive element, and a method of making a printed circuit board using this method of making a resist pattern.

The present inventors diligently carried out studies in order to achieve the above-mentioned objects and, as a result, have found that the above-mentioned objects can be achieved by a photosensitive element in which a layer made of a photosensitive resin composition comprising a specific ingredient is formed on a multilayer film.

Namely, the photosensitive element of the present invention is a photosensitive element comprising a support film and a photosensitive resin layer formed on the support film, wherein the support film is a multilayer support film comprising at least three layers; and wherein the photosensitive resin layer comprises a photosensitive resin composition comprising (A) a binder polymer, (B) a photopolymerizable compound having at least one polymerizable ethylenically unsaturated group within a molecule, and (C) a photopolymerization initiator.

In the photosensitive element of the present invention, the binder polymer preferably comprises, as a monomer unit, a monomer having a carboxyl group, and more preferably further comprises styrene or a styrene derivative as a monomer unit.

The photopolymerizable compound preferably comprises a photopolymerizable compound having one polymerizable ethylenically unsaturated group within a molecule and a photopolymerizable compound having two or more polymerizable ethylenically unsaturated groups within a molecule. The photopolymerizable compound preferably comprises a bisphenol A type (meth) acrylate compound and, in addition, the polymerization initiator preferably comprises a 2,4,5-triaryl imidazol dimer.

In the photosensitive element of the present invention, each layer in the multilayer support film preferably comprises polyester, an outermost layer in the multilayer support film preferably contains a particle having an average particle size which is 0.1 to 10 times the layer thickness of the outermost layer, and the layer thickness of the outermost layer in the multilayer support film is preferably 0.005 to 3 μm.

Also, the present invention provides a method of forming a resist pattern comprising the steps of laminating the photosensitive element of the present invention onto a circuit-forming substrate such that the photosensitive resin layer comes into close contact therewith; forming an exposure part by irradiating a predetermined part of the photosensitive resin layer with an active light beam; and then eliminating a part other than the exposure part.

Further, the present invention provides a method of making a printed circuit board comprising the step of etching or plating the circuit-forming substrate formed with a resist pattern by the method of forming a resist pattern in accordance with the present invention.

BEST MODES FOR CARRYING OUT THE INVENTION

In the following, the present invention will be explained in detail. In the present invention, (meth)acrylic acid refers to acrylic acid or methacrylic acid, (meth)acrylate refers to acrylate or its corresponding methacrylate, and (meth)acryloyl group refers to acryloyl group or its corresponding methacryloyl group.

Multilayer Support Film

The support film in the photosensitive element of the present invention is a multilayer film comprising at least three layers. Though the configuration of such a multilayer support film is not restricted in particular, each outermost layer thereof preferably contains particles to take into consideration slippage of the film and the like, and their average particle size is preferably 0.1 to 10 times, more preferably 0.2 to 5 times the layer thickness of the outermost layer. The slippage tends to be improper if the average particle size is less than 0.1 times, whereas irregularities are likely to occur in the layer of photosensitive resin composition if the average particle size exceeds 10 times.

Preferably, in the present invention, the particles are contained in the outermost layer by 0.5 to 50 wt %. Usable as examples of the particles include particles generated by various nucleating agents upon polymerization; aggregates; inorganic particles such as silicon dioxide particles (aggregated silica and the like), calcium carbonate particles, alumina particles, titanium oxide particles, and barium sulfate particles; organic particles such as crosslinked polystyrene particles, acrylic particles, and imide particles; and their mixtures.

At least one intermediate layer sandwiched between the outermost layers of the multilayer support film may contain the particles or not. From the viewpoint of resolution, it preferably does not contain the particles. In the case where the intermediate layer contains the particles, their content in the intermediate layer is preferably ⅓ or less, more preferably ⅕ or less of their content in the outermost layer.

From the viewpoint of resolution, the layer thickness of the outermost layer is preferably 0.005 to 3 µm, more preferably 0.01 to 1.5 µm. Preferably, the surface of outermost layer not facing the intermediate layer has a coefficient of static friction of 0.8 or less. If the coefficient of static friction exceeds 0.8, wrinkles will be likely to occur at the time of making a film and at the time of making a photosensitive element, and dust will tend to attach thereto since static electricity is likely to occur. In the present invention, the coefficient of static friction can be measured in conformity to ASTMD 1894.

The total thickness of the multilayer support film in the present invention is preferably 10 to 50 µm, more preferably 12 to 20 µm. The multilayer support film tends to tear upon peeling if its total thickness is less than 10 µm. If the total thickness exceeds 50 µm, it tends to lower the cost efficiency and deteriorate the resolution.

The multilayer support film preferably comprises an organic polymer. More preferably, each layer comprises polyester. Preferably, the multilayer support film is made by co-extruding two outermost layers and at least one intermediate layer. When the cost and easiness of manufacture are taken into consideration, the number of layers is preferably 3.

Namely, it is particularly preferable that the multilayer support film in the present invention be a laminate polyester film compositely formed by co-extruding a first polyester layer (outermost layer), a second polyester layer (intermediate layer), and a third polyester layer (outermost layer).

In this case, the first, second, and third polyester layers may be constituted by either the same kind or different kinds of polyester. In the present invention, however, the first and third polyester layers are preferably constituted by the same kind of polyester, preferably contain the same amount of the particles, and preferably have the same thickness. When the outermost layers have the same structure as such, the layer of photosensitive resin composition can be applied to either of the outermost layers, so that the coating surface is not mistaken at the time of coating and drying, whereby the handling becomes easy.

In the above-mentioned polyester, acid ingredients exemplified by aromatic dicarboxylic acids such as terephthalic acid and isophthalic acid, aliphatic dicarboxylic acids such as adipic acid and azelaic acid, alicyclic dicarboxylic acids such as cyclohexane dicarboxylic acid; and alcohol ingredients exemplified by aliphatic dials such as ethylene glycol, diethylene glycol, butane dial, and hexane diol, and alicyclic dials such as cyclohexane dimethanol can be used.

Though co-extrusion is preferably employed as a method of stacking the first, second, and third polyester layers as mentioned above, other known stacking methods such as laminating method can also be employed. The multilayer support film may have clear interfaces between layers. Alternatively, at least a part of the interfaces may be unclear due to the mixing of the layers and the like therebetween.

Binder Polymer

The photosensitive resin layer in the photosensitive element of the present invention comprises a binder polymer. Such a binder polymer may be of any kind. Examples thereof include organic polymers such as acrylic resins, styrene resins, epoxy resins, amide resins, amide-epoxy resins, alkyd resins, and phenol resins. Among them, acrylic resins are preferable.

Preferably, the binder polymer in the present invention is made by polymerizing (e.g., radically polymerizing) monomers having an ethylenically unsaturated double bond. Examples of the monomers having an ethylenically unsaturated double bond include styrene; styrene derivatives such as vinyl toluene, α-methylstyrene, p-methylstyrene, p-ethylstyrene, p-methoxystyrene, p-ethoxystyrene, p-chlorostyrene, and p-bromostyrene; acrylamides such as diacetone acrylamide; acrylonitrile; esters of vinyl alcohol such as vinyl-n-butyl ether; (meth)acrylic acid monomers such as alkyl (meth)acrylate, tetrahydrofurfuryl meth(acrylate), dimethylaminoethyl meth(acrylate), diethylaminoethyl meth(acrylate), glycidyl meth(acrylate), 2,2,2-trifluoroethyl (meth)acrylate, 2,2,3,3-tetrafluoropropyl (meth)acrylate, (meth)acrylic acid, α-bromo (meth)acrylic acid, α-chloro (meth)acrylic acid, β-furyl (meth)acrylic acid, and β-styryl (meth)acrylic acid; and maleic acid monomers such as maleic acid, maleic anhydride, monomethyl maleate, monoethyl maleate, and monoisopropyl maleate. In addition, fumaric acid, cinnamic acid, α-cyanocinnamic acid, itaconic acid, crotonic acid, and propiolic acid can be exemplified.

Examples of the above-mentioned alkyl meth(acrylate) include the compound expressed by the following general formula (I):

$$CH_2=C(R^1)-COOR^2 \qquad (I)$$

(where $R^1$ is hydrogen atom or methyl group, and $R^2$ is an alkyl group having a carbon number of 1 to 12); and the compound having hydroxide group, epoxy group, halogen group, or the like at the alkyl group of the compound expressed by the general formula (I).

Examples of the alkyl group having a carbon number of 1 to 12 indicated by $R^2$ in the above-mentioned general formula (I) include methyl group, ethyl group, propyl group, butyl group, pentyl group, hexyl group, heptyl group, octyl group, nonyl group, decyl group, undecyl group, dodecyl group, and their structural isomers. As the monomer expressed by the above-mentioned general formula (I), methyl (meth)acrylate, ethyl (meth)acrylate, propyl (meth) acrylate, butyl (meth)acrylate, pentyl (meth)acrylate, hexyl (meth)acrylate, heptyl (meth)acrylate, octyl (meth)acrylate, 2-ethylhexyl(meth)acrylate, and the like can be exemplified.

The binder polymers in the present invention may be used separately or in a combination of two or more kinds. For example, two or more kinds of binder polymers comprising respective copolymerizable ingredients different from each other, two or more kinds of binder polymers having respective weight-average molecular weights different from each other, two or more kinds of binder polymers having respective degrees of dispersion different from each other, or the like can be used in combination. In this case, the polymer having a multi-mode molecular weight distribution disclosed in Japanese Patent Application Laid-Open No. 11-327137 can be used.

In the present invention, from the viewpoint of alkali development property, the binder polymer comprises, as a monomer unit, a monomer having a carboxyl group. Such a polymer is manufactured by the polymerization of a monomer having a carboxyl group and an ethylenically unsaturated bond; or the copolymerization between such a monomer and another monomer. In the present invention, the monomer having a carboxyl group and an ethylenically unsaturated bond is preferably (meth)acrylic acid or maleic acid, more preferably methacrylic acid.

From the viewpoint of flexibility and the like, the binder polymer preferably contains styrene or a styrene derivative as a monomer unit. In the present invention, the styrene derivative refers to those obtained when hydrogen atom in styrene is replaced by substituents (e.g., organic groups such as alkyl groups, and halogen atoms), whose examples are mentioned above.

It is particularly preferred that the binder polymer in the present invention be one obtained when a monomer (preferably (meth)acrylic acid) having a carboxyl group and an ethylenically unsaturated bond is polymerized with styrene or a styrene derivative and, when necessary, another monomer. By use of such binder polymer, the photosensitive element of the present invention exhibits less bubble entraining and better resolution.

From the viewpoints of adhesion and peeling characteristics, the monomer unit of styrene or styrene derivative in the binder polymer is preferably 3 to 30 wt %, more preferably 4 to 28 wt %, and particularly preferably 5 to 27 wt % in the total monomer unit. If the content thereof is less than 3 wt %, the adhesion characteristic tends to become improper. If the content exceeds 30 wt %, by contrast, peeled pieces tend to become greater, thereby elongating the peeling time.

When the binder polymer in the present invention has a carboxyl group, the acid value of the binder polymer is preferably 30 to 200 mgKOH/g, more preferably 45 to 150 mgKOH/g. The development time tends to elongate if the acid value is less than 30 mgKOH/g, whereas the photocured resist tends to lower its resistance to developing solutions if the acid value exceeds 200 mgKOH/g.

The weight-average molecular weight of the binder polymer (measured by gel permeation chromatography (GPC) and converted with reference to a calibration curve using standard polystyrene) is preferably 20,000 to 200,000, more preferably 40,000 to 120,000. The resistance to developing solutions and the film strength tend to decrease if the weight-average molecular weight is less than 20,000, whereas the resolution tends to deteriorate if the weight-average molecular weight exceeds 200,000. The binder polymer may have a photosensitive group when necessary.

Photopolymerizable Compound

The photosensitive resin layer in the photosensitive element of the present invention contains, in addition to the binder polymer, a photopolymerizable compound having at least one polymerizable ethylenically unsaturated group within a molecule. Though the kind of such a photopolymerizable compound is not restricted in particular, examples thereof include compounds obtained when α,β-unsaturated carboxylic acids are caused to react with polyhydric alcohols; bisphenol A type (meth)acrylate compounds such as 2,2-bis(4-((meth)acryloxy polyethoxy) phenyl) propane, 2,2-bis(4-((meth)acryloxy polypropoxy) phenyl) propane, 2,2-bis(4-((meth)acryloxy polybutoxy) phenyl) propane, and 2,2-bis(4-((meth)acryloxy polyethoxy polypropoxy) phenyl) propane; compounds obtained when α,β-unsaturated carboxylic acids are caused to react with compounds having a glycidyl group; and urethane monomers such as meth(acrylate) compounds having a urethane bond within a molecule. In addition, nonylphenoxy polyoxyethylene acrylate; phthalic acid compounds such as γ-chloro-β-hydroxypropyl-β'-(meth)acryloxyethyl-o-phthalate, and β-hydroxyalkyl-β'-(meth)acryloxyalkyl-o-phthalate; and alkyl (meth)acrylate can be exemplified.

Examples of compounds obtained when α,β-unsaturated carboxylic acids are caused to react with polyhydric alcohols include polyethylene glycol di(meth)acrylate whose number of ethylene groups is 2 to 14, polypropylene glycol di(meth)acrylate whose number of propylene groups is 2 to 14, polyethylene/polypropylene glycol di(meth)acrylate whose number of ethylene group is 2 to 14 and whose number of propylene groups is 2 to 14, trimethylol propane di(meth)acrylate, trimethylol propane tri(meth)acrylate, EO-modified trimethylol propane tri(meth)acrylate, PO-modified trimethylol propane tri(meth)acrylate, EO/PO-modified trimethylol propane tri(meth)acrylate, tetramethylol methane tri(meth)acrylate, tetramethylol methane tetra(meth)acrylate, dipentaerythritol penta(meth)acrylate, and dipentaerythritol hexa(meth)acrylate.

Examples of 2,2-bis(4-((meth)acryloxy polyethoxy) phenyl) propane include 2,2-bis(4-((meth)acryloxy diethoxy) phenyl) propane, 2,2-bis(4-((meth)acryloxy triethoxy) phenyl) propane, 2,2-bis(4-((meth)acryloxy tetraethoxy) phenyl) propane, 2,2-bis(4-((meth)acryloxy pentaethoxy) phenyl) propane, 2,2-bis(4-((meth)acryloxy hexaethoxy) phenyl) propane, 2,2-bis(4-((meth)acryloxy heptaethoxy) phenyl) propane, 2,2-bis(4-((meth)acryloxy octaethoxy) phenyl) propane, 2,2-bis(4-((meth)acryloxy nonaethoxy) phenyl) propane, 2,2-bis(4-((meth)acryloxy decaethoxy) phenyl) propane, 2,2-bis(4-((meth)acryloxy undecaethoxy) phenyl) propane, 2,2-bis(4-((meth)acryloxy dodecaethoxy) phenyl) propane, 2,2-bis(4-((meth)acryloxy tridecaethoxy) phenyl) propane, 2,2-bis(4-((meth)acryloxy tetradecaethoxy) phenyl) propane, 2,2-bis (4-((meth)acryloxy pentadecaethoxy)phenyl)propane, and 2,2-bis(4-((meth)acryloxy hexadecaethoxy) phenyl) propane, among which 2,2-bis(4-(methacryloxy pentaethoxy) phenyl) propane is commercially available as BPE-500 (product name, manufactured by Shin-Nakamura Chemical Co., Ltd.), whereas 2,2-bis(4-(methacryloxy pentadecaethoxy) phenyl) propane is commercially available as BPE-1300N (product name, manufactured by Shin-Nakamura Chemical Co., Ltd.). The number of ethylene oxide groups within a molecule of the above-mentioned 2,2-bis(4-((meth)acryloxy polyethoxy) phenyl) propane is preferably 4 to 20, more preferably 8 to 15.

Examples of 2,2-bis(4-((meth)acryloxy polyethoxy polypropoxy) phenyl) propane include 2,2-bis(4-((meth)acryloxy diethoxy octapropoxy) phenyl) propane, 2,2-bis(4-((meth)acryloxy tetraethoxy tetrapropoxy) phenyl) propane, and 2,2-bis(4-((meth)acryloxy hexaethoxy hexatrapropoxy) phenyl) propane.

Examples of (meth) acrylate compounds having a urethane bond within a molecule include addition reaction products of (meth)acryl monomer having an OH group at β site with diisocyanate compounds such as isophorone diisocyanate, 2,6-toluene diisocyanate, 2,4-toluene diisocyanate, and 1,6-hexamethylene diisocyanate; tris((meth)acryloxy tetraethylene glycol isocyanate) hexamethylene isocyanurate; EO-modified urethane di(meth)acrylate; and EO/PO-modified urethane di(meth)acrylate. Examples of EO-modified urethane di(meth)acrylate include UA-11 which is a product name manufactured by Shin-Nakamura Chemical Co., Ltd. Examples of EO/PO-modified urethane di(meth) acrylate include UA-13 which is a product name manufactured by Shin-Nakamura Chemical Co., Ltd. Here, EO refers to ethylene oxide, whereas EO-modified compounds have a block structure of ethylene oxide group. On the other hand, PO refers to propylene oxide, whereas PO-modified compounds have a block structure of propylene oxide group. And, EO/PO modified compound means a compound modified with EO and PO.

Examples of nonylphenoxy polyoxyethylene acrylate include nonylphenoxy tetraoxyethylene acrylate (tetraoxyethylene nonylphenyl ether monoacrylate), nonylphenoxy pentaoxyethylene acrylate (pentaoxyethylene nonylphenyl ether monoacrylate), nonylphenoxy hexaoxyethylene acrylate (hexaoxyethylene nonylphenyl ether monoacrylate), nonylphenoxy heptaoxyethylene acrylate (heptaoxyethylene nonylphenyl ether monoacrylate), nonylphenoxy octaoxyethylene acrylate (octaoxyethylene nonylphenyl ether monoacrylate), nonylphenoxy nonaoxyethylene acrylate (nonaoxyethylene nonylphenyl ether monoacrylate), nonylphenoxy decaoxyethylene acrylate (decaoxyethylene nonylphenyl ether monoacrylate), and nonylphenoxy undecaoxyethylene acrylate (undecaoxyethylene nonylphenyl ether monoacrylate).

The photopolymerizable compounds exemplified above can be use separately or in a combination of two or more kinds.

From the viewpoints of resolution, development property and peeling characteristic, the photopolymerizable compound in the present invention preferably comprises a photopolymerizable compound having one polymerizable ethylenically unsaturated group within a molecule and a photopolymerizable compound having two or more polymerizable ethylenically unsaturated groups within a molecule. Examples of a photopolymerizable compound having one polymerizable ethylenically unsaturated group within a molecule include above-described nonylphenoxy polyoxyethylene acrylate, above-described phthalic acid compounds, and above-described alkyl (meth)acrylate.

On the other hand, examples of a photopolymerizable compound having two or more polymerizable ethylenically unsaturated groups within a molecule include above-described compounds obtained when α,β-unsaturated carboxylic acids are caused to react with polyhydric alcohols, above-described bisphenol A type (meth)acrylate compounds, and compounds obtained when α,β-unsaturated carboxylic acids are caused to react with compounds having multiple glycidyl groups.

Examples of a photopolymerizable compound having two or more polymerizable ethylenically unsaturated groups within a molecule further include above-described addition reaction products of (meth) acryl monomer having an OH group at β site with diisocyanate compounds, above-described tris((meth)acryloxy tetraethylene glycol isocyanate) hexamethylene isocyanurate, above-described EO-modified urethane di(meth)acrylate, and above-described EO/PO-modified urethane di(meth)acrylate.

When the photopolymerizable compound in the present invention comprises a photopolymerizable compound having one polymerizable ethylenically unsaturated group within a molecule and a photopolymerizable compound having two or more polymerizable ethylenically unsaturated groups within a molecule, the amount of the photopolymerizable compound having one polymerizable ethylenically unsaturated group within a molecule is preferably 5 to 60 wt % and more preferably 10 to 50 wt % based on the total weight of the photopolymerizable compound.

In addition, the photopolymerizable compound in the present invention preferably comprises, as an essential ingredient, a bisphenol A type (meth)acrylate compound or a (meth)acrylate compound having a urethane bond within a molecule. More preferably, it comprises, as an essential ingredient, a bisphenol A type (meth)acrylate compound. In the present invention, bisphenol A type (meth)acrylate compound refers to a compound obtained when bisphenol A is caused to react with (meth)acrylic acid (or halide (meth) acrylate), or a diol in which oxyalkylene or the like is added to bisphenol A is caused to react with (meth)acrylic acid (or halide (meth)acrylate), whose examples are mentioned above. Preferably, the bisphenol A type (meth)acrylate compound is one obtained when 1 mole of bisphenol A or a diol in which oxyalkylene or the like is added to bisphenol A is caused to react with 2 moles of (meth)acrylic acid (or halide (meth)acrylate).

When the photopolymerizable compound comprises a photopolymerizable compound having one polymerizable ethylenically unsaturated group within a molecule and a photopolymerizable compound having two or more polymerizable ethylenically unsaturated groups within a molecule, or when the photopolymerizable compound comprises a bisphenol A type (meth)acrylate compound or a (meth)acrylate compound having a urethane bond within a molecule, the photosensitive element of the present invention exhibits less bubble entraining and better resolution.

Photopolymerization Initiator

The photosensitive resin layer in the photosensitive element of the present invention further comprises a photopolymerization initiator in addition to the above-mentioned binder polymer and photopolymerizable compound. Though such a photopolymerization initiator may be of any kind, examples thereof include benzophenone; N,N'-tetraalkyl-4, 4'-diamino benzophenone such as N,N'-tetramethyl-4,4'-diamino benzophenone (Michler's ketone); aromatic ketones such as 2-benzyl-2-dimethylamino-1-(4-morpholinophenyl)-butanone-1,2-methyl-1-[4-(methylthio)phenyl]-2-morpholino-propanone-1; quinones such as alkyl anthraquinone; benzoin ether compounds such as benzoin alkyl ethers; benzoin compounds such as benzoin and alkyl benzoin; benzyl derivatives such as benzyl dimethyl ketal; 2,4,5-triaryl imidazole dimers such as 2-(o-chlorophenyl)-4,5-diphenyl imidazole dimer, 2-(o-chlorophenyl)-4,5-di(methoxyphenyl) imidazole dimer, 2-(o-fluorophenyl)-4,5-diphenyl imidazole dimer, 2-(o-methoxyphenyl)-4,5-diphenyl imidazole dimer, and 2-(p-methoxyphenyl)-4,5-diphenyl imidazole dimer; acridine derivatives such as 9-phenyl acridine and 1,7-bis(9,9'-acridinyl) heptane; N-phenyl glycine; N-phenyl glycine derivatives; and coumarin compounds.

The photopolymerization initiator in the present invention preferably comprises a 2,4,5-triaryl imidazole dimer, more preferably uses a 2,4,5-triaryl imidazole dimer and an N,N'-tetraalkyl-4,4'-diamino benzophenone together. The two 2,4,5-triaryl imidazoles constituting the 2,4,5-triaryl imidazole dimer may have structures identical to each other or different from each other. Namely, the kinds of triaryl groups in the 2,4,5-triaryl imidazole dimer may be identical or different from each other.

When the photopolymerization initiator comprises a 2,4, 5-triaryl imidazole dimmer, the photosensitive element of the present invention exhibits less bubble entraining and better resolution.

Compounding of Photosensitive Resin Composition

In the photosensitive element of the present invention, the photosensitive resin layer formed on the multilayer support film comprises a photosensitive resin composition comprising the above-mentioned (A) binder polymer, (B) photopolymerizable compound having at least one polymerizable ethylenically unsaturated group within a molecule, and (C) photopolymerization initiator.

In such a photosensitive resin composition, the content of (A) binder polymer is preferably 40 to 80 parts by weight, more preferably 45 to 70 parts by weight in 100 parts by weight in total of (A) and (B) ingredients. If the content is less than 40 parts by weight, the photocured product is likely to become brittle, whereby the coating property tends to deteriorate when making the photosensitive element. If the content exceeds 80 parts by weight, the photosensitivity tends to become insufficient.

The content of (B) photopolymerizable compound is preferably 20 to 60 parts by weight, more preferably 30 to 55 parts by weight in 100 parts by weight in total of (A) and (B) ingredients. The photosensitivity tends to become insufficient if the content is less than 20 parts by weight, whereas the cured product tends to become brittle if the content exceeds 60 parts by weight.

The content of (C) photopolymerization initiator is preferably 0.1 to 20 parts by weight, more preferably 0.2 to 10 by weight with respect to 100 parts by weight in total of (A) and (B) ingredients. If the content is less than 0.1 part by weight, the photosensitivity tends to become insufficient. If the content exceeds 20 parts by weight, the absorption at the surface of the composition tends to increase upon exposure, whereby the photocuring therewithin becomes insufficient.

When the content of (A), (B) and (C) ingredients is in the range described above, the photosensitive element of the present invention exhibits less bubble entraining and better resolution.

When necessary, the photosensitive resin composition may contain photopolymerizable compounds (such as oxetane compounds) having at least one cationically polymerizable cyclic ether group within a molecule, cation polymerization initiators, dyes such as malachite green, photochromic agents such as tribromo phenyl sulfone and leucocrystal violet, thermal coloring preventing agents, plasticizers such as p-toluene sulfonamide, pigments, fillers, antifoaming agents, flame retardants, stabilizers, adhesion promoting agents, leveling agents, peeling accelerators, antioxidants, flavors, imaging agents, thermal crosslinking agents, and the like by about 0.01 to 20 parts by weight each with respect to 100 parts by weight in total of (A) and (B) ingredients. They may be used separately or in a combination of two or more kinds.

Configuration of Photosensitive Element

The photosensitive element of the present invention comprises a multilayer support film and a photosensitive resin layer formed on the multilayer support film. Preferably, as mentioned above, the multilayer support film comprises the outermost layers with a thickness of 0.005 to 3 μm and has a total thickness of 10 to 50 μm. Preferably, the photosensitive resin layer on such a multilayer support film has a thickness of 1 to 100 μm.

When the photosensitive element of the present invention has above-described structure, it exhibits less bubble entraining and better resolution.

For protecting the photosensitive resin layer, a protective film may be provided on the photosensitive resin layer. Examples of such a protective film include polyethylene terephthalate, polypropylene, polyethylene, and polyester. From the viewpoint of transparency, polyethylene terephthalate films, polyethylene films, polypropylene films, and the like are preferably used. From the viewpoint of preventing air voids from occurring, a protective film having a low fish-eye level is preferably used. Such a protective film preferably has a thickness of 1 to 100 μm.

The photosensitive element of the present invention may further have intermediate layers such as cushion layers, adhesive layers, light-absorbing layers, and gas barrier layers; protective layers; and the like.

The photosensitive element of the present invention can be stored, for example, in a sheet-like form or in a roll-like form wound about a core with a protective film interposed therebetween. From the viewpoint of protecting end faces, an end face separator is preferably installed at an end face of the photosensitive element wound like a roll. From the viewpoint of resistance to edge fusion, a moisture-proof end face separator is preferably installed. As a packing method, it is preferably enveloped with a black sheet having a low moisture permeability.

Method of Making Photosensitive Element

Preferably, the photosensitive element of the present invention is made by applying a photosensitive resin composition to the multilayer support film prepared by the above-mentioned manufacturing method. Preferably, in this case, the photosensitive resin composition is dissolved in a solvent such as methanol, ethanol, acetone, methyl ethyl ketone, methyl Cellosolve, ethyl Cellosolve, toluene, N,N-dimethyl formamide, or propylene glycol monomethyl ether (or their mixed solvents) so as to yield a solution having a solid content of about 30 to 60 wt %, and then thus obtained solution is applied onto the multilayer support film. Preferably, the amount of application of the solution is such that the thickness obtained after evaporating the solvent is 1 to 100 μm.

Method of Forming Resist Pattern

The method of forming a resist pattern in accordance with the present invention comprises the steps of laminating the above-mentioned photosensitive element onto a circuit-forming substrate such that the photosensitive resin layer comes into close contact therewith; forming an exposure part by irradiating a predetermined part of the photosensitive resin layer with an active light beam; and then eliminating a part other than the exposure part.

In the case where the photosensitive element is laminated onto a circuit-forming substrate such that the photosensitive resin layer comes into close contact therewith, the photosensitive resin composition layer is preferably laminated onto the circuit-forming substrate as being pressed thereagainst with a pressure of about 0.1 to 1 MPa (about 1 to 10 kgf/cm$^2$) while being heated to about 70 to 130° C. after the protective film is eliminated when necessary. In this case, the lamination can also be carried out under reduced pressure.

The circuit-forming substrate in the present invention comprises an insulating layer and a conductive layer formed on the insulating layer, whereas the photosensitive resin layer is brought into close contact with the conductive layer from thereon. For example, when the circuit-forming substrate is one in which two conductive layers respectively formed on both sides of the insulating layer, the photosensitive resin layer is brought into close contact with at least one of the conductive layers from thereon. When the circuit-forming substrate is one in which a conductive layer is formed on one side of the insulating layer, the photosensitive resin layer is brought into close contact with the conductive layer or both of the conductive layer and insulating layer from thereon. Preferably, the conductive layer in the circuit-forming substrate is one comprising a metal (preferably copper).

After the lamination is thus completed, a predetermined part of the photosensitive resin layer is irradiated with an active light beam. The photosensitive resin layer may be irradiated with the active light beam by way of the multilayer support film or directly after the multilayer support film is peeled off. As means for irradiating a predetermined part of the photosensitive resin layer with an active light beam, a negative or positive mask pattern is preferably used.

Employed as the light source for the active light beam are known light sources, e.g., those effectively emit ultraviolet rays, visible light, and the like such as carbon arc lamps, mercury vapor arc lamps, high-pressure mercury-vapor lamps, and xenon lamps. They are also used in laser direct writing method.

After the exposure, the multilayer support film is eliminated when necessary, and the part other than the exposure part (unexposed part) is eliminated. The elimination is preferably carried out by development. As development means, wet development by use of an alkaline aqueous solution, an aqueous developing solution, an organic solution, and the like; dry development; and the like are preferably employed.

Examples of the alkaline aqueous solution include a dilute solution of 0.1 to 5 wt % sodium carbonate, a dilute solution of 0.1 to 5 wt % potassium carbonate, and a dilute solution of 0.1 to 5 wt % sodium hydroxide. The pH of the alkaline aqueous solution is preferably 9 to 11, whereas its temperature is adjusted in conformity to the developing property of the photosensitive resin composition layer. Also, surfactants, antifoaming agents, organic solvents, and the like may be mixed into the alkaline aqueous solution. As the developing technique, for example, dipping, spraying, brushing, slapping, and the like may be used.

After the development, heating at a temperature of 60 to 250° C. or exposure at about 0.2 to 10 J/cm$^2$ may be carried out when necessary, so as to further cure resist patterns.

Method of Making Printed Circuit Board

The method of making a printed circuit board in accordance with the present invention comprises the step of etching or plating the circuit-forming substrate formed with a resist pattern by the method of forming a resist pattern in accordance with the present invention.

For etching, cupric chloride solution, ferric chloride solution, alkali etching solution, and the like can be used for example. For plating, copper plating, solder plating, nickel plating, gold plating, and the like can be carried out, for example.

The resist pattern can be peeled off by an aqueous solution whose alkalinity is stronger than that of the alkaline aqueous solution used for development. As the strongly alkaline aqueous solution, 1 to 10 wt % aqueous sodium hydroxide solution, 1 to 10 wt % aqueous potassium hydroxide solution, and the like are used, for example. As the peeling technique, for example, immersion, spraying, and the like are used. The printed circuit board formed with the resist pattern may be a multilayer printed circuit board and may have through holes with small diameters.

EXAMPLES

Preferred examples of the present invention, which do not restrict the present invention, will now be explained in further detail.

Manufacturing Examples of Multilayer Support Film

Manufacturing Example 1

A multilayer support film in which first, second, and third polyester layers were laminated in this order was manufactured as follows.

Polyethylene terephthalate having an intrinsic viscosity of 0.6 was used as the resin for the first and third polyester layers, whereas polyethylene terephthalate having an intrinsic viscosity of 0.58 was used as the resin for the second polyester layer. When polymerizing the resins for the first and third polyester layers, 0.07 wt % of aggregated silica having an average particle size of 1.1 μm was added to the material. When polymerizing the resin for the second polyester layer, 0.01 wt % of aggregated silica having an average particle size of 1.0 μm was added thereto.

After the resins for the first to third polyester layers were dried to a moisture ratio of 200 ppm, the first, second, and third polyester layers were co-extruded at 290° C. so as to attain a film form, and then were rapidly cooled and solidified on a cooling roll controlled to have a surface temperature of 30° C.

This unextended laminate sheet was longitudinally drawn with a draw ratio of 3.8 at a drawing temperature of 115° C., subsequently widthwise drawn with a draw ratio of 3.7 at a drawing temperature of 120° C., and then heat-treated with a relaxation ratio of 5.0% at 215° C., whereby a multilayer film A having a total thickness of 20 μm in which the thickness ratio of the first polyester layer/second polyester layer/third polyester layer was 1/18/1 (μm) was obtained.

Manufacturing Example 2

A multilayer support film B was obtained in the same manner as Manufacturing Example 1 except that the thickness ratio of the first polyester layer/second polyester layer/third polyester layer was 1/14/1 (μm) with a total thickness of 16 μm.

Manufacturing Examples of Photosensitive Resin Composition

The (A) ingredients (A1 to A3), (B) ingredients (B1 to B5), (C) ingredients (C1 to C3), and other ingredients (D1 to D4 and E1 to E5) shown in the following Table 1 were mixed at weights shown in the following Table 2, whereby solutions of photosensitive resin compositions #1 to #5 were prepared. In Table 2, numbers indicate grams.

TABLE 1

| Item | Abbreviation | Material |
|---|---|---|
| (A) ingredient | A1 | 40 wt % toluene/methyl Cellosolve (weight ratio: 4/6) solution of methacrylic acid/methyl acrylate/styrene copolymer (with weight ratio of 25/50/25, weight-average molecular weight of 70,000, and acid value of 163 mgKOH/g) |
| | A2 | 40 wt % toluene/methyl Cellosolve (weight ratio: 4/6) solution of methacrylic acid/methyl methacrylate/ethyl acrylate/styrene copolymer (with weight ratio of 22/45/27/6, weight-average molecular weight of 100,000, and acid value of 144 mgKOH/g) |
| | A3 | 40 wt % toluene/methyl Cellosolve (weight ratio: 4/6) solution of methacrylic acid/methyl acrylate/butyl methacrylate/2-ethylhexyl acrylate copolymer (with weight ratio of 25/50/5/20, weight-average molecular weight of 80,000, and acid value of 163 mgKOH/g) |
| (B) ingredient | B1 | 2,2-bis(4-methacryloxy pentaetoxy)phenyl) propane |
| | B2 | UA-13*[1] |
| | B3 | γ-chloro-β-hydroxypropyl-β'-methacryloyloxyethyl-o-phthalate |
| | B4 | NP-8 EA*[2] |
| | B5 | APG-400*[3] |
| (C) ingredient | C1 | 4,4'-bis(diethylamino) benzophenone |
| | C2 | 2-(o-chlorophenyl)-4,5-diphenyl imidazole dimer |
| | C3 | N-1717*[4] |
| Other ingredient | D1 | leucocrystal violet |
| | D2 | p-toluene sulfonic acid amide |
| | D3 | malachite green |
| | D4 | tribromo methylphenyl sulfone |

TABLE 1-continued

| Item | Abbreviation | Material |
|---|---|---|
| Solvent | E1 | acetone |
| | E2 | N,N-dimethyl formamide |
| | E3 | methyl ethyl ketone |
| | E4 | toluene |
| | E5 | methanol |

*[1]EO/PO-modified urethane acrylate manufactured by Shin-Nakamura Chemical Co., Ltd.
*[2]EO-modified nonyl phenyl acrylate (whose ethylene glycol chain has a repeating unit of 8) manufactured by Kyoeisha Chemical Co., Ltd.
*[3]polypropylene glycol diacrylate (whose propylene glycol chain has a repeating unit of 6 to 7) manufactured by Shin-Nakamura Chemical Co., Ltd.
*[4]1,7-bis(9,9'-acridinyl) heptane manufactured by Asahi Denka Kogyo K.K.

TABLE 2

| Abbreviation | #1 | #2 | #3 | #4 | #5 |
|---|---|---|---|---|---|
| A1 | 150* | — | — | 150* | 150* |
| A2 | — | 150* | — | — | — |
| A3 | — | — | 150* | — | — |
| B1 | 30 | 30 | 30 | — | 30 |
| B2 | — | — | — | 30 | — |
| B3 | 10 | — | 10 | 10 | 10 |
| B4 | — | 5 | — | — | — |
| B5 | — | 5 | — | — | — |
| C1 | 0.15 | 0.2 | 0.15 | 0.15 | 0.15 |
| C2 | 3.0 | 3.0 | 3.0 | 3.0 | — |
| C3 | — | — | — | — | 0.2 |
| D1 | 0.5 | 0.5 | 0.5 | 0.5 | 0.5 |
| D2 | 4.0 | 4.0 | 4.0 | 4.0 | 4.0 |
| D3 | 0.05 | 0.05 | 0.05 | 0.05 | 0.05 |
| D4 | — | — | — | — | 1.0 |
| E1 | 10 | — | 10 | 10 | 10 |
| E2 | 3 | — | 3 | 3 | 3 |
| E3 | — | 10 | — | — | — |
| E4 | 10 | 10 | 10 | 10 | 10 |
| E5 | 3 | 3 | 3 | 3 | 3 |

150*: 60 as the solid content

Making of Photosensitive Element: Examples 1 to 8

Each of solutions of photosensitive resin compositions #1 to #5 was uniformly applied onto the multilayer support film A prepared in Manufacturing Example 1 or the multilayer support film B prepared in Manufacturing Example 2, and then was dried with a hot-air counter current canal dryer at a predetermined temperature for a predetermined period of time. A protective film (polyethylene film) having a thickness of 21 μm was laminated on thus obtained product, whereby a photosensitive element was obtained. Combinations of kinds of photosensitive resin composition, kinds of multilayer support film, and thickness of photosensitive resin composition were as shown in Table 3.

TABLE 3

| | Ex. 1 | Ex. 2 | Ex. 3 | Ex. 4 | Ex. 5 | Ex. 6 | Ex. 7 | Ex. 8 |
|---|---|---|---|---|---|---|---|---|
| Photosensitive composition | #1 | #1 | #2 | #1 | #1 | #3 | #4 | #5 |
| Multilayer support film | A | A | A | B | B | A | A | A |
| Thickness of photosensitive resin composition (μm) | 20 | 40 | 20 | 20 | 40 | 20 | 20 | 20 |

Making of Photosensitive Element: Comparative Examples 1 to 7

Photosensitive elements were obtained in the same manner as the above-mentioned Examples except that a single-layer support film C (polyethylene terephthalate film G2-18 manufactured by Teijin Ltd.) or a single-layer support film D (polyethylene terephthalate film G2-16 manufactured by Teijin Ltd.) was used in place of the multilayer support film A or B. Each of the support films C and D uniformly contained fine particles. Combinations of kinds of photosensitive resin composition, kinds of support film, and thickness of photosensitive resin composition were as shown in Table 4.

TABLE 4

| | Comp. Ex. 1 | Comp. Ex. 2 | Comp. Ex. 3 | Comp. Ex. 4 | Comp. Ex. 5 | Comp. Ex. 6 | Comp. Ex. 7 |
|---|---|---|---|---|---|---|---|
| Photosensitive composition | #1 | #1 | #2 | #1 | #3 | #4 | #5 |
| Support film | C | C | C | D | C | C | C |
| Thickness of photosensitive resin Composition (μm) | 20 | 40 | 20 | 20 | 20 | 20 | 20 |

Evaluation of Photosensitive Element

Each of the photosensitive elements of Examples 1 to 8 and Comparative Examples 1 to 7 was laminated on a copper plate (OLIN-194 having a sheet thickness of 0.15 mm manufactured by Yamaha-Olin Metal Corporation) while peeling off its protective film, and the entraining of bubbles was observed. Also, the laminate was cut into a short strip having a width of 20 mm and a length of 100 mm, and the support film (polyester film) was peeled at a test speed of 300 mm/min (using a rheometer RT-3010D-CW manufactured by Rheo Tec Messtechnik GmbH), whereupon the peel strength between the photosensitive resin composition and the support film was measured.

Concerning the laminate not peeling the support film, while using a photo tool having a Stoffer 21-step tablet as a negative, and a photo tool having a wiring pattern with a line width/space width of 10/10 to 47/47 (unit: μm) as a negative for evaluating the adhesion, an energy amount at which the remaining step number becomes 7.0 was determined, and this value was defined as the sensitivity. As the exposure apparatus, one having a 3-kW ultrahigh pressure mercury lamp (HMW-201B manufactured by K. K. Oak Manufacturing) was used.

After photocuring, the support film was eliminated, and the development was carried out by spraying with 1.0 wt % aqueous sodium carbonate solution at 30° C. After the development, the smallest value of the line width at which the lines and spaces were clarified was evaluated as the resolution. The foregoing results of evaluation were listed in Tables 5 and 6.

TABLE 5

|  | Ex. 1 | Ex. 2 | Ex. 3 | Ex. 4 | Ex. 5 | Ex. 6 | Ex. 7 | Ex. 8 |
|---|---|---|---|---|---|---|---|---|
| Peel strength (N/m) | 8.5 | 9.5 | 10 | 8.5 | 9 | 10 | 8.5 | 8.5 |
| Resolution (μm) | 15 | 35 | 15 | 15 | 35 | 15 | 18 | 18 |
| Entrained bubble (piece/m$^2$) | 0 | 0.1 | 0 | 0 | 0.1 | 0.1 | 0 | 0 |

TABLE 6

|  | Comp. Ex. 1 | Comp. Ex. 2 | Comp. Ex. 3 | Comp. Ex. 4 | Comp. Ex. 5 | Comp. Ex. 6 | Comp. Ex. 7 |
|---|---|---|---|---|---|---|---|
| Peel strength (N/m) | 6.5 | 7.5 | 7 | 7 | 7.5 | 7 | 6.5 |
| Resolution (μm) | 18 | 40 | 18 | 18 | 18 | 18 | 20 |
| Entrained bubble (piece/m$^2$) | 0.2 | 0.6 | 0.4 | 0.3 | 0.4 | 0.3 | 0.2 |

As can be seen from the above-mentioned Tables 5 and 6, the photosensitive elements of Examples 1 to 8 generated less bubble entraining, appropriate peel strength, and better resolution as compared with the photosensitive elements of Comparative Examples 1 to 7.

INDUSTRIAL APPLICABILITY

As explained in the foregoing, the present invention makes it possible to provide a photosensitive element comprising a support film and a photosensitive resin layer formed on the support film, which is hard to entrain bubbles when laminated on a circuit-forming substrate and can fully improve the resolution even in the case where the support film is a multilayer film of three or more layers or where the outermost layers contain fine particles. Also, it can provide a method of forming a resist pattern using such a photosensitive element, and a method of making a printed circuit board using this resist pattern.

The invention claimed is:

1. A photosensitive element comprising a support film and a photosensitive resin layer formed on said support film;
    wherein said support film is a multilayer support film that is substantially transparent to light, comprising at least three layers and the support film has a layer thickness of 10 to 50 μm and one of the at least three layers of the multilayer support film comprises an outermost layer containing particles;
    wherein said photosensitive resin layer comprises a photosensitive resin composition comprising (A) a binder polymer, (B) a photopolymerizable compound having at least one polymerizable ethylenically unsaturated group within a molecule, and (C) a photopolymerization initiator; and
    wherein the photosensitive resin layer has a layer thickness of 1 to 100 μm.

2. A photosensitive element according to claim 1, wherein said binder polymer comprises, as a monomer unit, a monomer having a carboxyl group.

3. A photosensitive element according to claim 2, wherein said binder polymer further comprises, as a monomer unit, styrene or a styrene derivative.

4. A photosensitive element according to claim 1, wherein said photopolymerizable compound comprises a photopolymerizable compound having one polymerizable ethylenically unsaturated group within a molecule and a photopolymerizable compound having two or more polymerizable ethylenically unsaturated groups within a molecule.

5. A photosensitive element according to claim 1, wherein said photopolymerizable compound comprises a bisphenol A type (meth)acrylate compound.

6. A photosensitive element according to claim 1, wherein said photopolymerization initiator comprises a 2,4,5-triaryl imidazole dimer.

7. A photosensitive element an average particle size which is 0.1 to 10 times the layer thickness of said outermost layer.

8. A method of forming a resist pattern comprising the steps of:
    laminating the photosensitive element according to claim 1 onto a circuit-forming substrate such that said photosensitive resin layer comes into close contact therewith;
    forming an exposure part by irradiating a predetermined part of said photosensitive resin layer with an active light beam; and then
    eliminating a part other than said exposure part.

9. A method of making a printed circuit board comprising the step of etching or plating a circuit-forming substrate formed with a resist pattern by the method of forming a resist pattern according to claim 8.

10. A photosensitive element comprising a support film and a photosensitive resin layer formed on the support film;
    wherein the support film is a multilayer support film comprising at least three layers;
    wherein the photosensitive resin layer comprises a photosensitive resin composition comprising (A) a binder polymer, (B) a photopolymerizable compound having at least one polymerizable ethylenically unsaturated group within a molecule, and (C) a photopolymerization initiator; and
    wherein each layer in the multilayer support film comprises polyester.

11. A photosensitive element according to claim 10, wherein said support film has a layer thickness of 10 to 50 μm and said photosensitive resin layer has a layer thickness of 1 to 100 μm.

12. A photosensitive element comprising a support film and a photosensitive resin layer formed on the support film;
    wherein the support film is a multilayer support film comprising at least three layers;
    wherein the photosensitive resin layer comprises a photosensitive resin composition comprising (A) a binder polymer, (B) a photopolymerizable compound having at least one polymerizable ethylenically unsaturated group within a molecule, and (C) a photopolymerization initiator; and
    wherein one of the at least three layers of the multilayer support film comprises an outermost layer having a layer thickness of 0.005 to 3 μm.

13. A photosensitive element according to claim 12, wherein said support film has a layer thickness of 10 to 50 μm and said photosensitive resin layer has a layer thickness of 1 to 100 μm.

* * * * *